United States Patent
Schrems et al.

[11] Patent Number: 6,068,928
[45] Date of Patent: May 30, 2000

[54] METHOD FOR PRODUCING A POLYCRYSTALLINE SILICON STRUCTURE AND POLYCRYSTALLINE SILICON LAYER TO BE PRODUCED BY THE METHOD

[75] Inventors: Martin Schrems, Langenbrück; Kai Wurster; Klaus-Dieter Morhard, both of Dresden; Joachim Hoepfner, Planegg, all of Germany

[73] Assignee: Siemens Aktiengesellschaft, Munich, Germany

[21] Appl. No.: 09/030,406

[22] Filed: Feb. 25, 1998

[51] Int. Cl.[7] .............................. B32B 9/04; H01L 21/36; H01L 21/425

[52] U.S. Cl. ........................... 428/446; 428/620; 438/45; 438/491; 438/514; 438/522; 438/532

[58] Field of Search ..................................... 428/427, 428, 428/446, 620, 641; 257/538, 535; 438/45, 97, 488, 491, 514, 522, 532, 764

[56] References Cited

U.S. PATENT DOCUMENTS

| | | |
|---|---|---|
| 4,062,707 | 12/1977 | Mochizuki et al. ..................... 148/187 |
| 4,114,254 | 9/1978 | Aoki et al. ................................. 29/571 |
| 4,406,051 | 9/1983 | Iizuka ..................... 29/576 B |
| 4,937,205 | 6/1990 | Nakayama et al. ..................... 437/165 |
| 5,242,855 | 9/1993 | Oguro ..................................... 437/109 |
| 5,354,381 | 10/1994 | Sheng ................... 118/723 E |
| 5,682,052 | 10/1997 | Hodges et al. ........................... 257/377 |

OTHER PUBLICATIONS

Widmann et al.: "Technologie hochintegrierter Schaltungen" Springer Verlag 1996, pp. 74–82, technology of high integrated circuits;.

Wolf et al.: "Silicon Processing", Lattice Press, 1987, pp. 161–197.

*Primary Examiner*—Timothy Speer
*Assistant Examiner*—Stephen Stein
*Attorney, Agent, or Firm*—Herbert L. Lerner; Laurence A. Greenberg; Werner H. Stemer

[57] ABSTRACT

A method for producing a polycrystalline silicon structure and a polycrystalline silicon layer to be produced by the method of first forming a primary silicon structure in an amorphous or polycrystalline form, and doping the structure with a dopant, in particular with oxygen, in a concentration exceeding the solubility limit. In a subsequent heat treatment, dopant precipitations are formed which control grain growth in a secondary structure being produced. Such a contact polycrystalline silicon structure can be used, in particular, as a connection of a monocrystalline silicon region.

10 Claims, 1 Drawing Sheet

METHOD FOR PRODUCING A POLYCRYSTALLINE SILICON STRUCTURE AND POLYCRYSTALLINE SILICON LAYER TO BE PRODUCED BY THE METHOD

BACKGROUND OF THE INVENTION

Field of the Invention:

The invention relates to a method for producing a polycrystalline silicon structure with a defined grain size on a semiconductor substrate.

In the production of integrated circuits, there is a frequent need for polycrystalline silicon structures, specifically as electric connections between circuit elements in particular, and as the circuit elements (for example capacitor electrodes) themselves. In that case, the crystal structure of the polysilicon is an important property. For example, it influences electric conductivity, diffusion of contaminants, the ability to structure narrow conductor tracks and adhesive properties, etc. . Details thereon are described in a book by Widmann, Mader and Friedrich, entitled "Techologie hochintegrierter Schaltungen" [Technology of Large-Scale Integrated Circuits], Chapter 3.8, Springer Verlag 1996, or in a book by Wolf and Tauber, entitled "Silicon Processing", Vol. 1, Chapter 6, Lattice Press 1987. In general, it is only polysilicon layers having a largely constant grain size or a narrow grain size distribution which can be used in semiconductor technology.

Polysilicon layers are usually produced by a CVD process such as is described, for example, in the reference by Widmann et al cited above. The mean grain size and the grain size distribution can be controlled by the temperature budget (temperature and time), and doping with boron, phosphorous, arsenic or similar materials, which is usually undertaken, also influences the grain size distribution which is achieved.

Doped polycrystalline silicon frequently constitutes the electric connection of a monocrystalline silicon region. An example thereof is a source region or drain region of a MOS transistor, or an emitter, base or collector of a bipolar transistor. The monocrystalline region in that case is mostly formed by a doped silicon region formed in the silicon substrate. The polycrystalline silicon structure forming the electric connection can be formed either from a polycrystalline silicon layer or from an amorphous silicon layer which becomes polycrystalline in later method steps.

In subsequent thermal steps, crystallization or recrystallization of the amorphous or polycrystalline silicon structure occurs. It is to be borne in mind in that case that the interface between the monocrystalline silicon region and the silicon structure mostly has a thin oxide, or can otherwise be contaminated or be of lower quality. That can lead to uncontrolled (re)crystallization, that is to say spatially strongly fluctuating grain sizes. The mechanical stress produced in the process can be reduced by the formation of crystal defects in the monocrystalline silicon such as, for example, the formation of dislocations. Those crystal defects worsen the electric properties of the substrate, for example by an increased leakage current. There Is therefore a risk that components or active structures disposed in the substrate (for example transistors, trench capacitors, pn junctions) do not have the prescribed electric properties, but already have incipient faults or medium term and long-term quality defects.

A first example of such a contact is the bit line contact in a DRAM memory, in which an arbitrary memory cell type is possible (for example a so-called stacked-cell or trench cell). A further example is the capacitor contact in such a cell, that is to say the contact between the memory electrode and the selection transistor. The problem occurs due to crystal defects, in particular in the case of memory cells having a trench capacitor, and is explained in detail in co-pending U.S. patent application Ser. No. 09/030,227, filed Feb. 25, 1998, entitled "Contact Between a Monocrystalline Silicon Region and a Polycrystalline Silicon Structure and Method For Producing Such a Contact" having the same inventors and the same filing date as the instant application

SUMMARY OF THE INVENTION:

It is accordingly an object of the invention to provide a method for producing a polycrystalline silicon structure and a polycrystalline silicon layer to be produced by the method, which overcome the hereinafore-mentioned disadvantages of the heretofore-known methods and products of this general type, in which the polycrystalline silicon structure has a defined grain size or defined grain size distribution and is intended to be suitable as a connection for a monocrystalline silicon region, without the occurrence of the problems explained above and in which the crystal structure is not to be substantially changed or worsened by possible subsequent thermal stresses.

With the foregoing and other objects in view there is provided, in accordance with the invention, a method for producing a polycrystalline silicon structure with a defined grain size on a substrate, which comprises forming a primary silicon structure in an amorphous or polycrystalline form on a substrate; doping the primary silicon structure with an oxygen-containing dopant in a concentration exceeding a solubility limit of the dopant in the silicon structure or silicon region; and carrying out a heat treatment to form dopant precipitations at a predetermined density in the silicon structure and a crystallization or recrystallization of the silicon structure, and predetermining a mean/maximum grain size of a secondary silicon structure produced in the process by the density of the dopant precipitations.

The invention utilizes a doping of a primary silicon structure, which is not monocrystalline, with a dopant from the group including oxygen, oxygen/nitrogen mixtures, oxygen/nitrogen compounds and other oxygen-containing mixtures or compounds, with a concentration of a dopant (in particular the oxygen) being selected in such a way that the solubility limits of the dopant is exceeded (the dopants can also be referred to as oxygen-containing dopants). As a result, dopant precipitations are formed during subsequent thermal steps in the primary silicon structure. At the same time, the primary silicon structure is converted into a polycrystalline secondary silicon structure by crystall-ization or recrystallization. In this case, the dopant precipitations permit the grain growth in the secondary silicon structure only up to a specific size. This grain size is determined by the density (that is to say the mean spacing) of the dopant precipitations. The dopant precipitations thus have, as it were, a cage effect. The higher the density of the dopant precipitations, the lower the maximum and the minimum polysilicon grain size in the silicon structure. The mean number (that is to say the density) of the dopant precipitations is controlled by the dopant supersaturation (dopant concentration divided by the solubility concentration) and the thermal budget (ramp rates, holding temperatures) in the subsequent heat treatments. The co-doping of other materials such as, for example, As, P, Sb, N, B can delay (As, P) or accelerate (B) the formation of oxygen-containing precipitations.

Given that the polysilicon structure produced according to the invention serves as a connection for a monocrystalline silicon region, the formation of crystal defects in the monosilicon is avoided, since the uncontrolled (re)crystallization in the silicon structure is suppressed. At the same time, a low contact resistance is achieved between the polycrystalline silicon structure and the monocrystalline silicon region.

Oxygen is particularly suitable as a dopant, since precipitations are formed particularly easily because of the low solubility of the oxygen. There is thus no need for high doping. The conductivity of the silicon structure or of the silicon region is not decisively reduced. Oxygen precipitations are then present as $SiO_x$, with $x \approx 2$.

In accordance with another mode of the invention, the density of the dopant precipitations is approximately $10^{15}$ to $10^{19} cm^{-3}$.

Ion implantation, plasma doping or Plasma Immersion Ion Implantation (PIII) can be used, in particular, as doping methods. These methods are familiar to the person skilled in the art and are explained in more detail, for example, in U.S. Pat. Nos. 5,354,381 and 4,937,205. The dose can be particularly well controlled in the case of plasma doping. The doping can be performed in such a way that the dopant is distributed uniformly in the silicon structure, that is to say that there is a dopant concentration which is essentially the same overall and lies above the solubility limit. On the other hand, a dopant maximum can be generated in a predetermined part of the silicon region or of the silicon structure, for example near the contact or at a prescribed depth. Furthermore, doping of a region of the monosilicon near the contact can also be performed instead of or in addition to the silicon structure. Dopant precipitations which act as barriers against a propagation of dislocation from the polycrystalline silicon are then produced near the contact in the monocrystalline silicon.

The silicon structure can also be doped in situ, that is to say during the CVD precipitation. A method corresponding to the known in-situ doping can be used for this purpose.

In accordance with a further mode of the invention, the concentration of a dopant in the silicon is in the region of $10^{17}$ to $10^{20}$ cm$^{-3}$, preferably in the region of $10^{18}$ to $10^{19}$ cm$^{-3}$.

Further details on reducing the polycrystalline silicon structure are described in co-pending U.S. patent application Ser. No. 09/030,227, filed Feb. 25, 1998, entitled "Contact Between a Monocrystalline Silicon Region and a Polycrystalline Silicon Structure and Method For Producing Such a Contact" having the same inventors and the same filing date as the instant application, the overall disclosure of which is also included herein.

In accordance with an added mode of the invention, there is provided a method which comprises additionally doping the silicon structure with a dopant of n-type conductivity or p-type conductivity for generating an n-type conductivity or p-type conductivity.

In accordance with an additional mode of the invention, there is provided a method which comprises doping the silicon structure in a spatially homogeneous manner or in a spatially inhomogeneous manner.

In accordance with yet another mode of the invention, there is provided a method which comprises forming a maximum in the dopant distribution at a prescribed depth in the silicon structure.

In accordance with yet a further mode of the invention, there is provided a method which comprises adjoining the silicon structure with a monocrystalline silicon region and using the silicon structure as an electric connection of the silicon region.

With the objects of the invention in view there is also provided a polycrystalline silicon layer produced according to the method.

Other features which are considered as characteristic for the invention are set forth in the appended claims.

Although the invention is illustrated and described herein as embodied in a method for producing a polycrystalline silicon structure and a polycrystalline silicon layer to be produced by the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
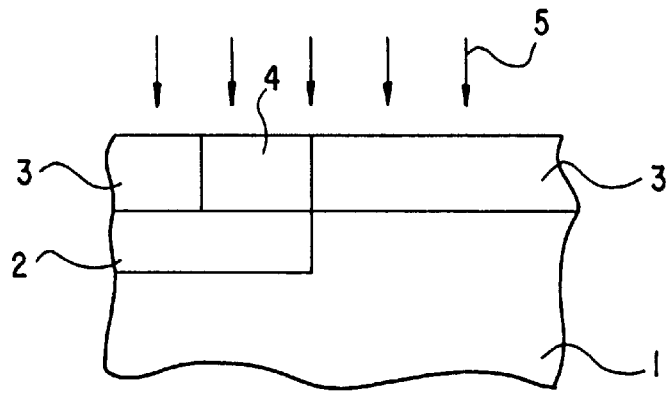
FIGS. 1 and 2 are fragmentary, diagrammatic, cross-sectional views through a semiconductor substrate having a mono-crystalline silicon region at which an exemplary embodiment of the invention is illustrated.

Referring now to the figures of the drawings in detail and first, particularly, to FIG. 1 thereof, there is seen a silicon substrate 1 which has a doped monocrystalline region 2 on its surface. The doped monocrystalline region 2 can, for example, be a source region of an MOS transistor. A primary silicon structure 4 which is disposed on the doped monocrystalline region 2 is not monocrystalline but, for example, is polycrystalline and has been formed by a precipitation process. The configuration has remaining regions provided with an insulation 3. According to the invention, the polysilicon structure 4 is doped with a dopant, for example oxygen. The doping can be performed, for example, by vertical ion implantation. The implantation can be carried out over the whole surface if that is compatible with the remaining semiconductor circuit. In this case, the implantation parameters are selected in such a way that the dopant concentration in the polysilicon structure 4 exceeds the solubility limit. In the case of oxygen doping, the concentration of the dopant in the primary Si structure is preferably $10^{17}$ to $10^{20}$ cm$^{-3}$, in particular it is in the range of $10^{18}$ to $10^{19}$ cm$^{-3}$. For example, in the case of a 300 nm thick polysilicon layer 4 a dose of 3 to $5 \times 10^{13}$ cm$^{-2}$ is selected in conjunction with an energy of 3 to 5 keV.

Figure 2:
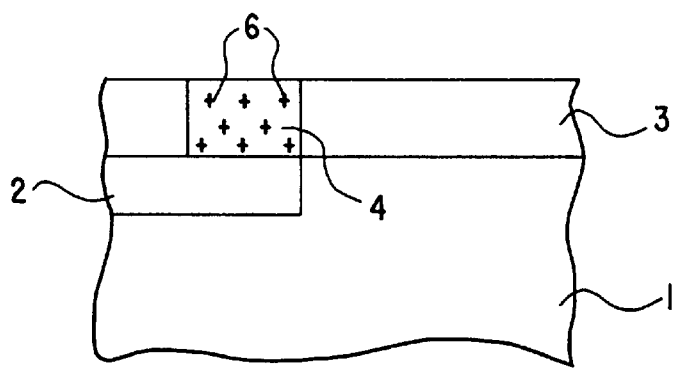

FIG. 2 shows that subsequently, a thermal step is carried out, for example 30 min at 900–1000° C., whereby dopant deposits 6, in this case $SiO_x$ deposits, are formed in the polysilicon structure 4. As was explained above, these limit the grain growth in the silicon structure (cage effect) and a narrow grain size distribution is achieved in the secondary polycrystalline silicon. The propagation of crystal defects into the doped region 2 and into the substrate 1 (FIG. 2) is prevented.

The doping can also be performed by another method, for example oxygen plasma doping (time: 10 seconds, energy 1 keV at the given layer thickness).

Instead of uniform doping, it is possible to generate a local dopant maximum at a prescribed point, for example by oblique implantation. A further possibility is generating the maximum at a prescribed depth in the silicon structure. This is particularly favorable when, as in the figure, the aim is to form a contact to an underlying substrate. The dopant maximum is then placed near the substrate surface. For this purpose, only a thin Si structure is firstly formed as part of the primary silicon structure on the substrate surface, for example by depositing a 30 nm thick amorphous silicon layer. The latter is doped, then silicon is applied at the required residual thickness, and the thermal step is carried out.

Figure 3:
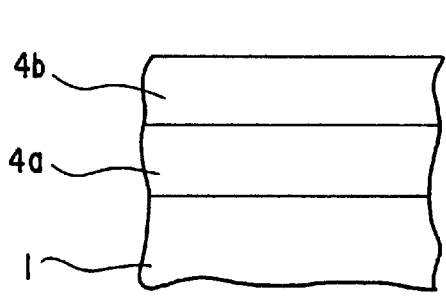
FIGS. 3 and 5 are fragmentary, cross-sectional views through a semiconductor substrate having a monocrystalline silicon region at which a further exemplary embodiment of the invention is illustrated.

FIG. 3 shows an exemplary embodiment in which the primary silicon structure is applied in two substructures 4a, 4b, with an undoped a-Si-layer or poly-Si-layer 4a firstly being applied to the substrate, and then a highly doped a-Si-layer or poly-Si-layer 4b. The two sublayers can, for example, be applied through the use of CVD. As in the first example, a thermal step is carried out.

Figure 4:
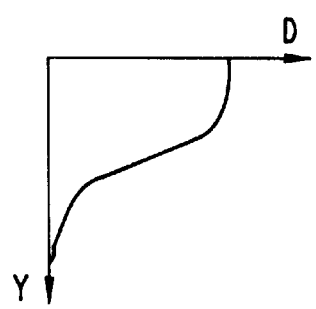
FIG. 4 shows a dopant profile obtained for FIGS. 3 and 5.
Figure 5:
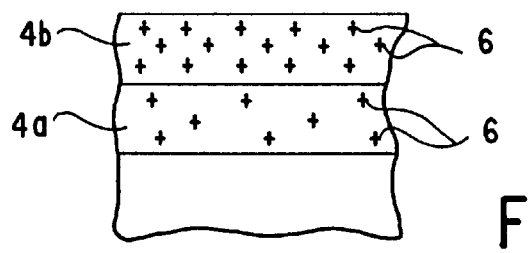

FIG. 4 shows the dependence of a dopant concentration D on a depth y. FIG. 5 shows that after the heat treatment, dopant deposits having a density which is higher in the higher-doped sublayer 4b than in the sublayer 4a, are formed in the sublayers 4a, 4b. The grain size which is achieved in the higher-doped sublayer 4b is therefore less than in the sublayer 4a.

The sublayers can also be disposed in such a way that the higher-doped sublayer is situated below the lower-doped sublayer.

The invention can also be used to produce a polysilicon layer of defined grain size without contact with the monocrystalline substrate. It is also possible to deposit a polysilicon layer which is disposed over the entire surface and can be doped with oxygen above the solubility limits and then structured to form conductor tracks or other structures.

In many instances, the polycrystalline silicon structure is additionally doped by using known methods with a dopant of n-type or p-type conductivity, in order to achieve a desired conductivity. This additional doping is preferably performed by using an in-situ method for the deposition. Since the (re)crystallization of a polysilicon layer is also influenced by the doping, the doping according to the invention and the heat treatment are to be tailored thereto.

We claim:

1. A method for producing a polycrystalline silicon structure with a defined grain size on a substrate, which comprises:

forming a primary-silicon structure in an amorphous or polycrystalline form on a substrate;

doping the primary silicon structure with an oxygen-containing dopant in a concentration exceeding a solubility limit of the dopant in the silicon structure or silicon region; and carrying out a heat treatment to form dopant precipitations at a predetermined density in the silicon structure and a crystallization or recrystallization of the silicon structure, and predetermining at least one of a mean grain size and a maximum grain size of a secondary silicon structure developed by the density of the dopant precipitations.

2. The method according to claim 1, which comprises generating a dopant concentration in a region of $10^{17}$ to $10^{20}$ cm$^{-3}$ in the primary silicon structure.

3. The method according to claim 1, which comprises heating the silicon structure to 700 to 1100° C. during the heat treatment.

4. The method according to claim 1, which comprises setting a density of the dopant precipitations in the secondary silicon structure in a region of $10^{15}$ to $10^{19}$ cm$^{-3}$.

5. The method according to claim 1, which comprises additionally doping the silicon structure with a dopant of n-type conductivity or p-type conductivity for generating an n-type conductivity or p-type conductivity.

6. The method according to claim 1, which comprises doping the silicon structure in a spatially homogeneous manner.

7. The method according to claim 1, which comprises doping the silicon structure in a spatially inhomogeneous manner.

8. The method according to claim 7, which comprises forming a maximum in the dopant distribution at a prescribed depth in the silicon structure.

9. The method according to claim 1, which comprises adjoining the silicon structure with a monocrystalline silicon region and using the silicon structure as an electric connection of the silicon region.

10. A polycrystalline silicon layer with a defined grain size on a substrate, comprising:

a crystallized silicon structure formed by heat treating one of an amorphous and polycrystalline silicon on a substrate, said crystallized silicon structure doped with an oxygen-containing dopant in a concentration exceeding a solubility limit of the dopant in one of the amorphous and polycrystalline silicon, said crystallized silicon structure having dopant precipitations formed at a predetermined density and at least one of a mean grain size and a maximum grain size predetermined by the density of the dopant precipitations.

* * * * *